United States Patent
Yarmolich et al.

(10) Patent No.: US 11,970,400 B2
(45) Date of Patent: Apr. 30, 2024

(54) CARBON MATERIALS

(71) Applicant: PLASMA APP LTD., Didcot (GB)

(72) Inventors: Dmitry Yarmolich, Didcot (GB); Denis Yarmolich, Didcot (GB); Ramachandran Vasant Kumar, Didcot (GB); Rumen Tomov, Didcot (GB); Hyun-Kyung Kim, Didcot (GB); Teng Zhao, Didcot (GB)

(73) Assignee: PLASMA APP LTD., Didcot (GB)

( * ) Notice: Subject to any disclaimer, the term of this patent is extended or adjusted under 35 U.S.C. 154(b) by 237 days.

(21) Appl. No.: 16/579,509

(22) Filed: Sep. 23, 2019

(65) Prior Publication Data

US 2020/0095129 A1 Mar. 26, 2020

(30) Foreign Application Priority Data

Sep. 24, 2018 (GB) ..................... 1815535

(51) Int. Cl.
*C01B 32/22* (2017.01)
*C23C 14/06* (2006.01)
(Continued)

(52) U.S. Cl.
CPC .......... *C01B 32/22* (2017.08); *C23C 14/0605* (2013.01); *C23C 14/3485* (2013.01);
(Continued)

(58) Field of Classification Search
CPC ..... C01B 32/22; C01B 32/182; C01B 32/186; C23C 14/46; C23C 14/48; C23C 14/0605;
(Continued)

(56) References Cited

U.S. PATENT DOCUMENTS

| 4,822,466 A * | 4/1989 | Rabalais ................. C30B 23/02 |
| | | 204/192.15 |
| 2005/0233209 A1* | 10/2005 | Sudano ............... H01M 50/533 |
| | | 174/126.1 |

(Continued)

FOREIGN PATENT DOCUMENTS

| CN | 105977458 | 9/2016 | |
| CN | 105977458 A * | 9/2016 | ............. B82Y 30/00 |

(Continued)

OTHER PUBLICATIONS

Oldfield, Multilayer graphene deposited by a filtered cathodic vacuum arc, RMIT University Nov. 2017 (Year: 2017).*

(Continued)

*Primary Examiner* — William E McClain
*Assistant Examiner* — Bartholomew A Hornsby
(74) *Attorney, Agent, or Firm* — Amster, Rothstein & Ebenstein LLP

(57) ABSTRACT

There is described a carbon material comprising $sp^2$ and $sp^3$ hybridised carbon. Also described is a method of making a carbon material the method comprising: exposing a substrate to a flux of at least $10^{11}$ carbon ions per $cm^2$ of substrate per 1 ms, a majority of the carbon ions having a kinetic energy of at least 10 eV. Further, electrodes comprising the carbon material are described. The electrodes may operate as an anode in Li ion battery characterised with improved specific capacity and operation life-time.

25 Claims, 13 Drawing Sheets

(51) Int. Cl.
*C23C 14/34* (2006.01)
*C25B 11/043* (2021.01)
*H01M 4/139* (2010.01)
*H01M 4/583* (2010.01)
*H01M 4/66* (2006.01)

(52) U.S. Cl.
CPC ............ C25B 11/043 (2021.01); H01M 4/139 (2013.01); H01M 4/583 (2013.01); H01M 4/661 (2013.01); *C01P 2004/64* (2013.01); *C01P 2006/12* (2013.01); *C01P 2006/40* (2013.01)

(58) Field of Classification Search
CPC ............ C23C 14/3442; C23C 14/3485; C25B 11/043; C25B 14/044
See application file for complete search history.

(56) References Cited

U.S. PATENT DOCUMENTS

| | | |
|---|---|---|
| 2009/0169968 A1 | 7/2009 | Iseki et al. |
| 2012/0097525 A1 | 4/2012 | Harkness, IV et al. |
| 2013/0341204 A1* | 12/2013 | Sung .................... C25B 11/073 204/263 |
| 2014/0272592 A1* | 9/2014 | Thompkins ........... H01M 4/134 252/182.1 |
| 2017/0247789 A1 | 8/2017 | Yarmolich |
| 2018/0083281 A1* | 3/2018 | Cheng .................... C01B 32/05 |
| 2018/0269486 A1* | 9/2018 | Umetsu .................. H01G 11/32 |

FOREIGN PATENT DOCUMENTS

| | | | |
|---|---|---|---|
| CN | 107464917 | | 12/2017 |
| CN | 108565124 | | 9/2018 |
| JP | 2011258348 | | 12/2011 |
| JP | 2011258348 A | * | 12/2011 |
| KR | 20160043853 A | * | 4/2016 |
| RU | 2614330 C1 | | 3/2017 |
| WO | 0224972 A1 | | 3/2002 |

OTHER PUBLICATIONS

Daniel Thomas Oldfield, Multilayer graphene deposited by a filtered cathodic vacuum arc, 2017, RMIT University, Thesis (Year: 2017).*
Harry Marsh, Activated Carbon, 2006, Elsevier Science, Chpater 9, p. 473 (Year: 2006).*
Search report for application GB1815535.8.
Ferrari, Andrea C. "Raman spectroscopy of graphene and graphite: Disorder, electron-phonon coupling, doping and nonadiabatic effects". Solid State Communications 143 (2007) 47-57.

* cited by examiner

CARBON MATERIALS

The present application claims the benefit of GB Patent Application Serial No. 1815535.8 filed Sep. 24, 2018, which is hereby incorporated by reference in its entirety.

TECHNICAL FIELD

This invention relates to carbon materials, methods of making such materials, and electrodes and electrochemical cells containing such materials.

FIELD OF THE DISCLOSURE

This invention relates to carbon materials, methods of making such materials, and electrodes and electrochemical cells containing such materials.

BACKGROUND

In the lithium ion battery field there is a demand for electrode materials, in particular anode materials, with high specific energy (lithium storage) capacities and cycle stabilities. Although graphite anodes have good stability and low cost, their experimental specific capacity is about 330 mAh/g (the theoretical maximum capacity is 372 mAh/g, R. Dash, et. al., Sci. Rep. 6, 27449; doi: 10.1038/srep27449 (2016)), which does not meet requirements of current and future technologies, for example in the automotive area.

Si- and P-based materials are considered as promising candidates because their specific capacities can reach as high as 4,200 and 2,596 mAh/g. However, they both suffer from the poor reversibility caused by a large volume expansion>300%.

There is a continuous research for novel allotropes or forms of carbon materials with new or improved properties in the context of batteries.

For example, a prediction of a new two-dimensional metallic carbon allotrope was made in 2012 by Xin-Quan Wang (DOI: 10.1039/c2cp43070c). The allotrope named "net W" consists of square C4, hexagonal C6, and octagonal C8 carbon rings and should exhibit metallic-like electric conductivity. By means of first-principles calculations the net W carbon phase was predicted to be stable. Further theoretical investigations of the carbon allotrope predicted that the specific energy capacity can be up to 1675 mAh/g, about 4.5 times larger than that of a commercial graphite anode (Yu et al. in 2018—DOI: 10.1063/1.5013617).

To date there is no chemical method of synthesis of large net W fragments.

An alternative approach to increase gravimetric capacity has been to use disordered carbon. For example, the lithium storage capacity of hard carbon (non-graphitizable) has been reported to be 550 mAh/g ('A new strategy to mitigate the initial capacity loss of lithium ion batteries'—DOI: 10.1016/j.jpowsour.2016.05.063), i.e. greater than the theoretical value for graphite. It has been shown that hard carbon material consists of randomly aligned small-dimensional graphene layers (doi: 10.1016/0008-6223(96)00177-7). Hard carbon generally has only $sp^2$ carbon bonds and is generally obtained by pyrolysis of organic materials. The main disadvantage of hard carbon and related materials is a significant irreversible drop of the specific capacity during cycling compared to graphite. Also, the hard carbon requires use of binder to provide an electrical and mechanical contact to the current collector. The binder increases the total mass of the battery with no contribution to the capacity, hence reduces the overall energy density.

Thus, it remains a challenge to develop an anode material with high specific energy capacity and stability during long-term cyclability.

It is an object of the present invention to address at least one problem associated with the prior art.

SUMMARY OF THE INVENTION

From a first aspect, the invention provides a new carbon material comprising $sp^2$ and spa hybridised carbon.

From a second aspect, the invention provides a method of making a carbon material, the method comprising: exposing a substrate to a flux of at least $10^{11}$ carbon ions per $cm^2$ of substrate per 1 ms, a majority of the carbon ions having a kinetic energy of at least 10 eV.

From a third aspect, the invention provides a carbon material obtainable by the method according to the second aspect of the invention.

From a fourth aspect, the invention provides an electrode for an electrochemical cell, the electrode comprising a carbon material according to any aspect or embodiment of the invention.

From a fifth aspect, the invention provides a method of manufacturing an electrode, the method comprising incorporating a carbon material according to any aspect or embodiment of the invention into an electrode.

From a sixth aspect, the invention provides an electrochemical cell comprising a carbon material and/or electrode according to any aspect or embodiment of the invention.

From a seventh aspect, the invention provides the use of a carbon material according to any aspect or embodiment herein in an electrochemical cell.

Throughout the description and claims of this specification, the words "comprise" and "contain" and variations of the words, for example "comprising" and "comprises", mean "including but not limited to", and do not exclude other components, integers or steps. Moreover, the singular encompasses the plural unless the context otherwise requires: in particular, where the indefinite article is used, the specification is to be understood as contemplating plurality as well as singularity, unless the context requires otherwise.

Optional features of each aspect of the invention may be as set out in the preceding paragraphs, in the claims and/or in the following detailed description, drawings and examples. Within the scope of this application it is expressly intended that the various aspects, embodiments, examples and alternatives may be taken independently or in any combination. That is, all embodiments and/or features of any embodiment can be combined in any way and/or combination, unless such features are incompatible.

DETAILED DESCRIPTION

Some aspects of the invention relate to a carbon material. The carbon material may comprise $sp^2$ and spa hybridised carbon and/or may be obtained by deposition of high flux, high energy carbon ions.

The term "carbon material" is used herein to refer to a material comprising carbon. Carbon materials may be formed essentially from carbon or may be doped with other species. The invention thus embraces both undoped and doped carbon materials. Purity or composition of a material may, for example, be determined by Glow Discharge Mass Spectrometry.

It should be noted that the exposure of carbon materials to the atmosphere generally results in the absorption of impurities such as oxygen. Thus, even undoped carbon materials will generally contain species absorbed from the atmosphere.

Advantageously, the carbon material may contain at least 20 w % carbon, optionally at least 50 w % carbon, or even at least 80 w % carbon. Generally, an undoped carbon material might be expected to contain at least 80 w % carbon, optionally at least 90 w % carbon, or even at least 95 w % carbon based on the total weight of the material. A remainder of the material might be made up, for example, of oxygen or other impurities. Doped carbon material might be expected to contain, for example, at least 20 w % carbon, at least 50 w % carbon or even at least 70 w % carbon.

The carbon material may advantageously be electrically conductive in the sense that it allows the flow of an electrical current. Any detectable flow of an electric current can indicate electrical conductivity. Suitably, the carbon material may have an electrical conductivity of at least 1 S/m, optionally at least 100 S/m, or even at least 20000 S/m. Electrical conductivity of thin films along the surface is measured herein as illustrated in Example 12. The conductivity will depend, to an extent, on the thickness of the material being measured.

Advantageously, the carbon material may have a specific lithium storage capacity greater than that of graphite. Specific lithium storage capacity is defined herein as a measured value obtained from a standard cell as illustrated in Example 15. In this context, it is noted that the specific lithium storage capacity of graphite as defined herein is about 330 mAh/g.

Suitably, the initial specific lithium storage capacity of the carbon material may be at least 400 mAh/g. Advantageously, the initial specific lithium storage capacity of the carbon material may be at least 500 mAh/g, at least 800 mAh/g, at least 1000 mAh/g, or even at least 1800 mAh/g.

The carbon material may offer a useful electrochemical cycling stability. The term "cycling stability" is used herein to refer to the ability of the carbon material to retain a specific lithium storage capacity over multiple charge/discharge cycles of a cell.

Suitably, the carbon material may have a specific lithium storage capacity after 200 cycles (in the standard cell illustrated in Example 15) of at least 400 mAh/g, at least 500 mAh/g, at least 600 mAh/g, or even at least 700 mAh/g.

The carbon material may advantageously offer a rapid charge and/or discharge rate. It was found that the carbon material can show better Coulombic efficiencies for higher cycling rates and for thicker carbon electrodes. Embodiments of the carbon material were tested in a coin cell configuration in LP30 electrolyte. A 10 μm thick carbon material was used to build an anode, and a commercial LiFePO$_4$ cathode (P/N ratio 1.2) was used. A few initial cycles were required to achieve the stable cycling probably due to the solid electrolyte interface formation. In various embodiments, for 0.01 A/g, 0.1 A/g, 1 A/g C-rates the Coulombic efficiency was found to be 88%, 98%, and 99% respectively. The Coulombic efficiency may thus suitably be at least 80%, at least 95% and at least 99% respectively for these C-rates.

Without wishing to be bound by theory, it is thought that presence of both sp$^2$ and spa hybridised carbon in the carbon material is of advantage. In particular, it is believed that sp$^2$ content provides advantageous conductivity, whilst sp$^3$ content provides advantageous hardness, which can enhance cyclability in the context of an electrode. The presence of both sp$^2$ and sp$^3$ hybridised carbon may be inferred, for example, based on XPS analysis.

In various embodiments, the percentage of sp$^2$-type carbon in the carbon material is at least 25 w %, for example at least 50 w %, or even at least 75 w % based on the total weight of the carbon material. Optionally, the percentage of sp$^2$-type carbon may be at most 90 w %, for example at most 85 w % or even at most 60 w % based on the total weight of the carbon material.

In various embodiments, the percentage of sp$^3$-type carbon in the carbon material is at least 2 w %, for example at least 10 w %, or even at least 20 w % based on the total weight of the carbon material. Optionally, the percentage of sp$^3$-type carbon may be at most 50 w %, for example at most 35 w % or even at most 15 w % based on the total weight of the carbon material.

The percentage of sp$^2$-type or sp$^3$-type carbon may be determined by XPS analysis, as exemplified in Examples 7 and 11 hereinbelow.

The morphology of the carbon material may also contribute to advantageous properties. In various embodiments, the carbon material has been characterised as having a hierarchical pore morphology. A hierarchical pore morphology comprises three types of pores: micropores, mesopores, and macropores.

As used herein, the term "micropores" may be defined as pores having a pore diameter less than about 100 nm. As used herein, the term "mesopores" may be defined as pores having a pore diameter between about 100 and about 1000 nm. As used herein, "macropores" may be defined as pores having a pore diameter greater than 1 micron. Pore sizes may, for example, be determined by analysis of SEM images, as exemplified hereinbelow.

The surface area of the material may advantageously be at least 1000 m$^2$/g, optionally at least 2000 m$^2$/g or even at least 3000 m$^2$/g. Surface area may be measured using standard BET analysis. In one embodiment, the standard BET measurement provided BJH Absorption cumulative area of pores between 1.7 nm and 300 nm diameter of 2110 m$^2$/g with adsorption/desorption cumulative volume of the pores of 59.4 cm$^3$/g.

The carbon material may have a disordered nanostructure. In particular, the carbon material may comprise both amorphous and crystalline portions.

In various embodiments, the carbon material comprises nanocrystals. The term "nanocrystals" is used herein to refer to a discrete area of crystallinity whose largest dimension does not exceed 100 nm. An area of crystallinity is an area in which the atoms of the carbon material are ordered in a lattice. The nanocrystals may typically be embedded in amorphous carbon. Nanocrystals can be detected by X-Ray Diffraction (XRD) or Transmission Electron Microscopy (TEM) analysis.

In various embodiments, the carbon material may comprise areas of regularly arranged layers of carbon. Such areas may be embedded in amorphous carbon. The areas may constitute nanocrystals or may form a network of layers. In various embodiments, an area may comprise single or few-layer sheets of carbon with a regular arrangement. For example, an area may comprise in the range of from 1 to 100 carbon layers, or in the range of from 5 to 50 layers. The layers may appear as graphene-like 2D sheets of carbon that are regularly arranged.

In various embodiments, the inter-layer spacing between individual layers in areas of regularly arranged carbon may be greater than 0.335 nm (i.e. greater than the inter-layer spacing in graphite). Suitably, the inter-layer spacing may be in the range of from 0.340 nm to 0.370 nm, optionally in the range of from 0.348 to 0.366 nm. In various embodiments, the average inter-layer spacing in the areas may be in the range of from 0.345 to 0.365 nm, optionally in the range of from 0.350 to 0.360 nm. Inter-layer spacing may be measured as set out in Example 8 hereinbelow.

The carbon material may be a doped material. Suitably, the doped carbon material may comprise in the range of from 0.1 w % to 30 w % of one or more dopants, for example in the range of from 0.1 w % to 10 w % dopant(s), or in the range of from 0.2 w % to 5 w % dopant(s) based on the total weight of the doped material. Examples of dopants which may make up the doped material together with carbon include Si, P, Fe, Cu, Li, Al, N, O, S, P, B, Ti, Co, Ni, Na, K or any other material including metals, semiconductors, polymers or gases.

The weight percentage of dopant(s) in the carbon material may, for example, be determined by Glow Discharge Mass Spectrometry.

The dopant can provide additional functionality to the carbon material or enhance or suppress already existing functionality. For example, Si dopant increases the specific capacity for lithium ions, while Cu doping improves conductivity and hardness but decreases the specific capacity.

Advantageously, the dopant may form chemical bonds with carbon, for example as a result of co-deposition with carbon. Additionally, or alternatively, dopant may be incorporated into the carbon material as particles or layers.

Advantageously, the carbon material may be monolithic. The carbon material may form a film. Alternatively, the carbon material may be provided in particulate form, optionally mixed with a binder.

The carbon material may be formed on a substrate. Additionally, or alternatively, the carbon material may be freestanding.

Suitably, the carbon material may form a film having a thickness of at least 10 nm, optionally at least 1000 nm, or even at least 10 μm or at least 50 μm.

Substrates for the carbon material may be of any suitable type. Suitably, the substrate may be a support capable of enhancing mechanical strength, for example to permit deployment of the carbon material in an electrode or cell. Such a support may take a wide range of forms. The support may be an internal of an electrochemical cell. For example, the support may comprise a monolithic surface, a membrane, grid or a fabric.

Advantageously, the substrate may comprise an electrode substrate, for example as will be described.

Advantageously, the carbon material may bear a current collector layer. The current collector layer may comprise metal, for example a vapour deposited layer thereof. Suitable metals include, without limitation, copper, aluminium, and lithium, and any combination thereof.

The carbon material may be obtained by suitable vapour deposition of carbon. Physical vapour deposition (PVD) may be employed to form the carbon material. PVD generally involves a stream of molecules, atoms or ions directed toward a substrate. This stream condenses to form a solid-state material on the substrate.

Without wishing to be bound by theory, it has been found that the carbon material may be obtained by PVD with a high flux of high-energy carbon ions.

Furthermore, it has been found that, on being deposited by PVD, the carbon material may advantageously form chemical bonds with the substrate. The need for binders or the like to adhere the carbon material to a substrate can thus be eliminated.

In various embodiments of the invention, the carbon material may be obtained by pulsed vapour deposition of carbon ions.

Pulsed Laser Deposition (PLD) and Pulsed Electron Deposition (PED) are known forms of PVD. In these techniques a high energy density pulse from a laser or electron beam ablates a target, turning some amount of solid target into a plasma. This plasma expands outward, towards a substrate, in the form of a plasma plume and is deposited.

PED generally requires an electron beam source providing an electron beam energy density of $\geq 10^8$ W/cm$^2$ at the target surface. Known apparatuses and methods to produce such electron beams are based on channel-spark discharge (CSD) techniques—see e.g. U.S. Pat. Nos. 5,576,593 and 7,557,511.

Virtual cathode deposition (VCD) is a PVD technique that solves certain problems associated with the short life-time of CSD based deposition tools used in PLD and PED. A non-limiting example of a VCD device and method of deposition of thin films are described in WO2016042530, which is incorporated herein by reference.

An aspect of the invention relates a method of making a carbon material by exposing a substrate to a flux of at least $10^{11}$ carbon ions per cm$^2$ of substrate per 1 ms, a majority of the carbon ions having a kinetic energy of at least 10 eV.

Exposure of the substrate results in deposition of the carbon ions. Such a high flux, high energy deposition has now been found to be possible and to lead to carbon materials with advantageous properties.

The number of carbon ions per cm$^2$ of substrate may be determined by the measuring of the ion current density with a collimated Faraday Cup.

Suitably, the flux may comprise at least $10^{12}$ carbon ions per cm$^2$ per 1 ms or even at least $10^{13}$ carbon ions per cm$^2$ per 1 ms. Optionally, the flux may comprise at least $10^{11}$ carbon ions per cm$^2$ per 0.2 ms, or at least $10^{12}$ carbon ions per cm$^2$ per 0.2 ms, or even at least $10^{13}$ carbon ions per cm$^2$ per 0.2 ms.

A majority of the carbon ions has a kinetic energy of at least 10 eV, optionally at least 15 eV, or even at least 20 eV. The energy of carbon ions may be determined according to a time-of-flight method, as illustrated in Example 2.

The carbon ions may suitably be generated by ablation of a carbon graphite target.

Suitably, the method may comprise pulsed vapour deposition of the carbon ions, i.e. the flux may be pulsed. Suitably, the frequency of pulsing may be in the range of from 1-20000 Hz, optionally 100-2000 Hz, or even 100-600 Hz, such as 20 Hz-200 Hz.

Optionally, the duration of the pulses may be in the range of from 0.1-1000 μs, optionally 1-500 μs, or even 20-200 μs, such as 10-20 μs.

In various embodiments, a flux of at least $10^{11}$ carbon ions per cm$^2$ of substrate, or at least $10^{12}$ carbon ions per cm$^2$ substrate, or even at least $10^{13}$ carbon ions per cm$^2$ substrate may be deposited in one pulse.

The total pulse energy per pulse may suitably be greater than 2.5 J, or greater than 4 J, or even greater than 4.5 J.

The method may of course comprise depositing a plurality of pulses. Suitably, the method may comprise pulsed deposition for a period of at least 1 second, at least 1 minute, or even at least 10 hours. Optionally, continuous deposition may be performed on a moving substrate.

A pulsed deposition of the carbon ions may suitably be achieved by ablation of a carbon graphite target with a suitably pulsed power source, for example a pulsed electron beam source. The pulsing of the power source may, for example, be in accordance with the parameters listed above. The pulsed power source may suitably be operated to generate pulses of >15 kV voltage. The pulsed power source may advantageously have an internal impedance of less than 15 Ohm, optionally less than 10 Ohm, or even less than 5 Ohm.

The deposition may advantageously be performed under a vacuum, as will be understood by those skilled in the art.

In various embodiments of the invention the method may comprise a virtual cathode deposition (VCD) process. In such a process, a virtual plasma cathode (VPC) is used as a pulsed electron beam source.

A virtual cathode deposition process may, for example, comprise providing a hollow cathode, a substrate and a carbon target, the substrate and the target being located on opposite sides of the hollow cathode, supplying plasma to the interior of the hollow cathode at an end of the hollow cathode nearest the target, and supplying a high voltage pulse to the hollow cathode, such that a virtual plasma cathode is formed and such that the virtual plasma cathode generates an electron beam, directed towards the target wherein a plume of ablated target material comprising the carbon ions passes through the hollow cathode towards the substrate and is deposited thereon.

Advantageously, to support high flux, high energy deposition, the high voltage pulse may be provided from a power source having an internal impedance of less than 15 Ohm, optionally less than 10 Ohm, or even less than 5 Ohm.

The high voltage pulse may be pulsed, for example, in accordance with the parameters listed above. The voltage of the high voltage pulse may, for example be >15 kV.

Optionally, the method may comprise depositing one or more dopants. Non-limiting examples of suitable dopant species, and optional concentrations, are listed above in respect of the first aspect of the invention.

Dopant ions may be deposited using any suitable technique (e.g. PLD, PED or VCD). The dopant ions may conveniently be deposited together with the carbon ions, for example as part of a virtual cathode deposition process. This may be achieved, for example by including the dopant in a target that is ablated to form the ions to be deposited.

Alternatively, the dopant may be deposited separately from the carbon ions. A preferred method comprises generating carbon ions from a first source, and dopant ions from a second source, the carbon and dopant ions optionally being deposited together onto the substrate.

Optionally, the dopant may be added to the carbon material after carbon ion deposition is complete.

In various embodiments, the dopant may be deposited using VCD (as described above but with a dopant target instead of a carbon target). Suitably, the method may comprise generating carbon ions from a first VCD source with a carbon target and dopant ions from a second VCD source with a dopant target, the carbon and dopant ions optionally being deposited together onto the substrate.

The carbon material may advantageously be used in batteries or supercapacitors.

Some aspects of the invention relate to an electrode for an electrochemical cell comprising a carbon material according to, or obtained according to, any aspect or embodiment of the invention.

The carbon material may constitute a vapour deposited layer and/or may be provided in particulate form within a binder.

The electrode may comprise an electrode substrate bearing the carbon material. The carbon material may suitably have a thickness in the range of from 0.3-200 μm on the substrate.

The electrode substrate may comprise any suitable substrate or support.

In various embodiments, the substrate comprises a current collector. The current collector may comprise a metal, e.g. a metal foil. Suitable metals include, without limitation, copper and aluminium.

The interface between the current collector and the carbon material may comprise an additional interlayer. The interlayer may suitably comprise Ti, Si, Al or any other material enhancing adhesion, current conductivity or specific capacity. This may also be formed by vapour deposition.

However, it is not essential the substrate to be a current collector. The substrate may simply comprise a (non-conducting) support.

In various embodiments, the electrode substrate comprises a polymeric support. One example of a polymeric support is a polymeric membrane. Suitable membranes are used in the art as battery or supercapacitor separators. Suitably, the support may comprise a multi-layer polyolefinic membrane, e.g. comprising polyethylene or polypropylene.

Advantageously, the carbon material may bear a current collector layer. The current collector layer may comprise metal, for example a vapour deposited layer thereof. Suitable metals include, without limitation, copper, aluminium, and lithium, and any combination thereof. A current collector layer is of particular benefit if the substrate is non-conducting.

The electrode may of course comprise a connector for connecting the electrode, in particular a current collector thereof, to an electric circuit.

An aspect of the invention relates to a method of manufacturing an electrode, the method comprising incorporating a carbon material according to any aspect or embodiment of the invention into an electrode.

The method may comprise depositing the carbon material by PVD, suitably according to any aspect or embodiment of the invention.

The carbon material may optionally be combined with other components, such as a binder, before being incorporated into the electrode. For example, a particulate carbon material may be prepared and mixed with a binder before being incorporated into an electrode.

Additionally, or alternatively, the carbon material may be deposited onto an electrode substrate, i.e. a substrate that forms part of the electrode. The electrode substrate may optionally be as hereinabove described.

Preferably, the method of manufacturing an electrode comprises deposition of the carbon material onto a support, which may optionally be as hereinabove defined in respect of other aspects of the invention.

In various embodiments, the carbon material may be deposited onto a current collector. Advantageously, a carbon material according to according to any aspect or embodiment of the invention may be deposited with a method according to any aspect or embodiment of the invention as a film with thickness of 0.3-200 μm on a current collector. An example of a suitable current collector is copper foil. Other suitable materials include those listed above.

The method may comprise depositing an interlayer between the current collector and the carbon material. Thus, the method may comprise vapour depositing an interlayer onto the current collector and then depositing the carbon material. The interlayer may suitably comprise Ti, Si, Al or any other material enhancing adhesion, current conductivity or specific capacity.

In various embodiments, the carbon material may be deposited onto a support, suitably a polymeric support. The method may advantageously comprise deposition of the carbon material on the support followed by the deposition of a current collector.

Advantageously, a carbon material according to the first aspect of invention may be deposited onto a polymeric membrane with a method according to any aspect or embodiment of the invention, followed by vapour deposition of a conductive material (e.g. as described above) as a current collector. In this case a reduction of the current collector weight can be achieved due to utilising the polymeric membrane as a mechanical support for the carbon material.

Advantageously, a flexible polymeric support may accommodate volume changes of the carbon material during cycling with less stress creation. The current collector which can be deposited thinner than 10 µm, or even thinner than 5 µm, or thinner than 2 µm, would provide additional flexibility to the electrode. Sandwiching the active material between the separator and a thin polymeric membrane advantageously allows the weight of the electrode to be reduced whilst keeping the electrode hard and flexible at the same time, improving the cyclability and decreasing the irreversible capacity.

Advantageous electrochemical and physical properties of an electrode according to any aspect or embodiment of the invention may be of use in various devices. Electrochemical properties may comprise high specific capacity, high surface area, hierarchical porosity, high electrical conductivity, possibility to dope the material, absence of binder. The physical properties are mechanical hardness, good electrical contact between the active material and current collector, low mass of the current collector, flexible support of the active material by the separator and current collector.

Suitably, the electrode may be used in an ion cell (e.g. lithium or sodium), a solid-state cell, a fuel cell, or a supercapacitor.

An aspect of the invention relates to an electrochemical cell comprising a carbon material and/or electrode according to any aspect or embodiment of the invention. The electrochemical cell may be a primary or secondary cell.

The cell may comprise an anode and a cathode connected by a salt bridge, or individual half-cells separated by a porous membrane. The cell may comprise connectors allowing an electric current to be drawn from electrodes of the cell. The electric current may, for example, be used to power an electronic device or a motor, for example in an automobile.

The electrochemical cell may optionally be a lithium ion cell, a sodium ion cell, a sulphur cell, a fuel cell, or a supercapacitor.

Advantageously, carbon material may be borne by one or more internals of the electrochemical cell. Non-limiting examples of internals are internal walls and separators. The internals may be non-current collecting. Additionally, or alternatively, the cell may comprise an electrode including the carbon material.

Suitably, the electrochemical cell may be a lithium ion cell. Suitably, the electrode may form the anode. Alternatively, in various embodiments, the electrochemical cell may be a supercapacitor, for example a lithium ion capacitor.

An aspect of the invention relates to the use of a carbon material according to any aspect or embodiment herein in an electrochemical cell, optionally an anode of a lithium ion battery. The use may be for the purpose of achieving a specific energy capacity threshold, and/or a cyclability threshold, and/or a charge or discharge speed threshold, for example a threshold as defined anywhere herein.

Throughout the description and claims of this specification, the words "comprise" and "contain" and variations of the words, for example "comprising" and "comprises", mean "including but not limited to", and do not exclude other components, integers or steps. Moreover, the singular encompasses the plural unless the context otherwise requires: in particular, where the indefinite article is used, the specification is to be understood as contemplating plurality as well as singularity, unless the context requires otherwise.

Preferred features of each aspect of the invention may be as described in connection with any of the other aspects. Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible.

BRIEF DESCRIPTION OF THE DRAWINGS

One or more non-limiting embodiments of the invention will now be described, by way of example only, with reference to the accompanying drawings, in which:

FIG. 17 shows the outcome of the electrochemical test of Example 15.

EXAMPLES

In various embodiments, the invention provides a method of making a carbon material using a VCD process.

Figure 1:
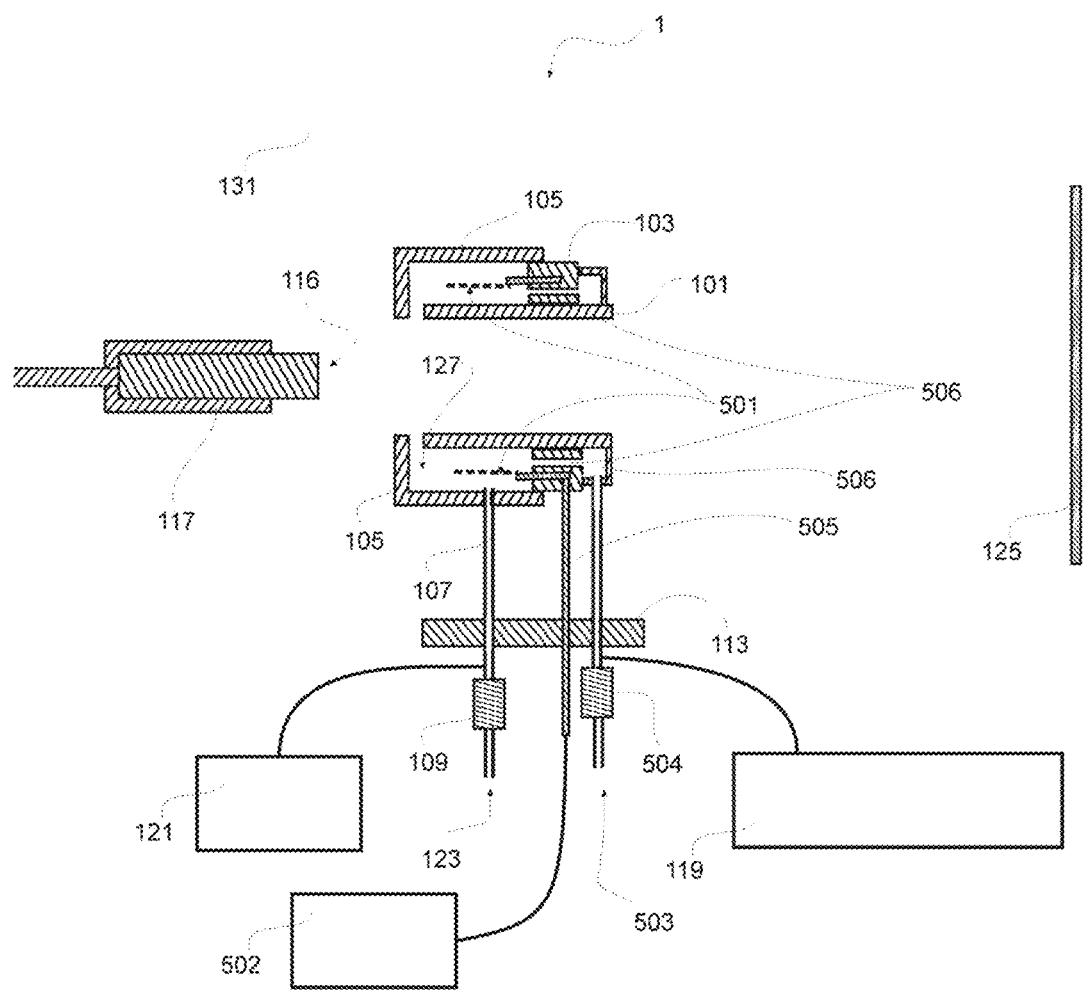
FIG. 1 is a schematic drawing showing an apparatus for carrying out a virtual cathode deposition process.

With reference to FIG. 1, the VCD process comprises providing a hollow cathode, a substrate and a carbon target, the substrate and the target being located on opposite sides of the hollow cathode. A plasma is supplied to the interior of the hollow cathode at an end of the hollow cathode nearest the target. A high voltage pulse is then supplied to the hollow cathode, such that a virtual plasma cathode is formed and such that the virtual plasma cathode generates an electron beam, directed towards the target. A plume of ablated target material comprising carbon ions passes through the hollow cathode towards the substrate and is deposited thereon.

The VCD process thus utilizes a Virtual Plasma Cathode (VPC) as a pulsed electron beam source. Prior to each pulse of the electron beam, a new plasma cathode is generated by fast (e.g. 100 ns) ionization of an operational gas. The plasma cathode acquires negative high voltage potential with respect to a target due to the application to the plasma of a high-voltage and high-current pulse (e.g. 100-10000 ns) generated by a Pulsed Power Generator (PPG). This causes the VPC to form in the vicinity of the target and an electron beam is extracted from the plasma boundary. The electron beam ablates the target and then the VPC decays, leaving a space for ablated target material in the form of a plasma plume to propagate toward a substrate, where it condenses forming a carbon material.

Repetition of the pulse, which starts with the formation of a new VPC and ends with the condensing of the target material on the substrate, allows a material to grow on the substrate with controlled growth rate and properties.

Deposited material properties, such as the crystal structure (formation of chemical bonds between the atoms of the film) or the lack of it, adhesion (formation of the bonds between the film and substrate), electrical conductivity (energy gap between conduction and valence band) and roughness (surface crystal state or structure and the number of phases), are dependent on the target material plume plasma kinetic energy, ionization level, temperature, and density. The plasma plume parameters in turn depend on the electron beam parameters.

Example 1—Deposition of Carbon Material

Figure 5:
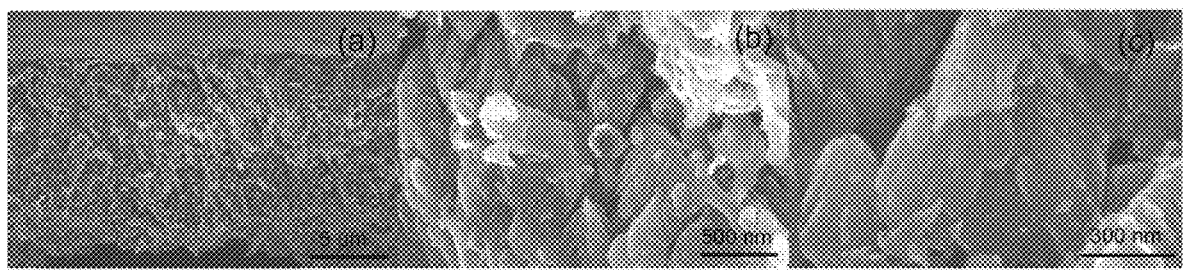
FIG. 5 is a series of scanning electron microscope (SEM) images of the cross-section of carbon material sample C7 of Example 3.

A VCD tool generally as described in WO2016042530 with reference to FIG. 5 thereof was used to generate a carbon ion flux and deposit a carbon material. The disclosure of WO2016042530 is incorporated herein by reference. FIG. 5 of WO2016042530 is reproduced herein as FIG. 1.

The deposition process was performed with some key modifications of the teaching of WO2016042530. In particular, the total VCD pulse energy was raised to >2.5 J and the pulsed power source was modified to have an internal impedance of 10 Ohm or lower. The triggering pulse parameters and gas supply were modified to further improve electron beam focusing. This increased the overall energy density of the electrons beam on the target surface, which in turn improved the energy delivered to the plume plasma and increased the kinetic energy of the deposited carbon ions above 20 eV. The modifications are explained below in more detail.

With reference to FIG. 1, the apparatus 1 was provided with a graphite target 117 (99% purity), and an aluminium substrate 125. The chamber 127 was pumped down to $10^{-5}$ mbar ($10^{-3}$ Pa) initial pressure. Then argon gas was introduced from sources 123, 503 to increase the pressure in the chamber up to $4 \cdot 10^{-4}$-$8 \cdot 10^{-4}$ mbar ($3 \cdot 10^{-2}$-$8 \cdot 10^{-2}$ Pa), with the gas supply from source 503 providing 60% to 80% of the total gas flow.

Pulsed power source 119 had an internal impedance of 10 Ohm or lower, and was operated to generate pulses of >15 kV voltage at 20 Hz-200 Hz repetition rate. The total pulse energy per pulse was greater than 2.5 J, preferably 4 J or 4.5 J. The duration of the pulses was 10-20 µs.

When a pulse reached its maximal voltage, a trigger pulse was supplied by the trigger pulse generators 121, 502. The trigger pulse voltages were in the range of +5 to +15 kV and had a duration of 2 µs. A first trigger pulse was generated by trigger pulse generator 502 and a second pulse by trigger pulse generator 121, with no delay between the first and second pulses beginnings. The trigger pulse generators 121 and 502 were modified to have an internal impedance of 100 Ohm and total energy of 0.05 J per pulse each. This allowed the simultaneous energy injection from 121 and 502 into the initial plasma 127 increasing its temperature and density by at least 20% compared with the previous setup of a short non-simultaneous trigger pulses.

The electrical pulses caused the formation of a virtual plasma cathode, which in turn generated an electron beam to ablate the target. The denser virtual cathode accompanied with the lower impedance of the pulsed power source led to a higher electron beam current (increase on 20%) and energy density of the electron beam on the target. A plasma plume was formed and condensed on the substrate which was placed at 20 cm distance from the target. A carbon material was formed on the substrate.

The substrate temperature did not exceed 60° C. The deposition rate at a distance of 25 cm from the target was measured with a quartz-crystal microbalance (QCM) and was determined to be 0.01 nm/pulse for 4 J total energy of the pulse.

Example 2—Characterisation of Deposition

Figure 2:
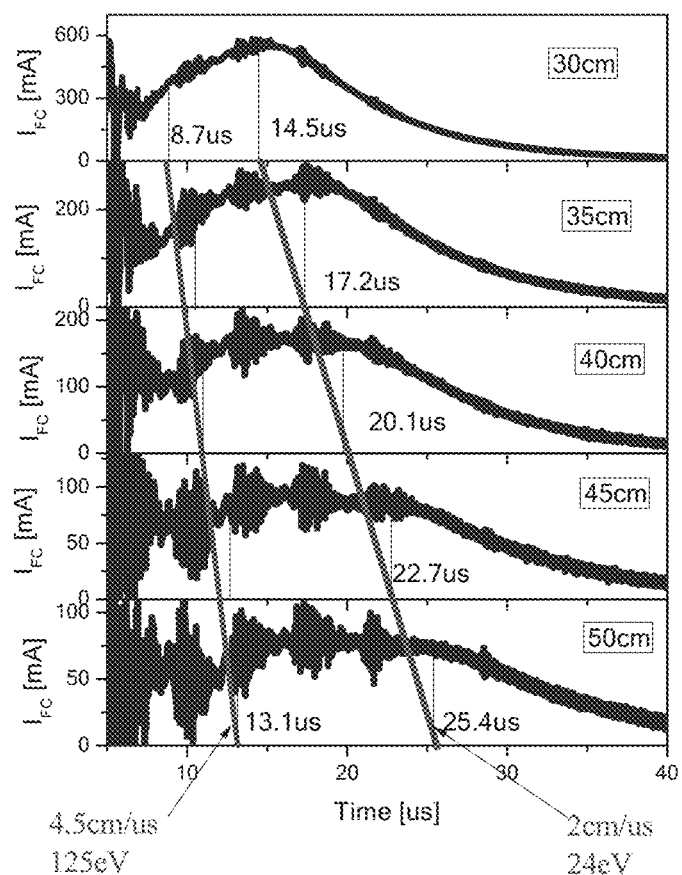
FIG. 2 is a series of graphs showing time-of-flight measurements of the carbon ion plume generated in the VCD process of Example 1, taken at various distances from the graphite target.

The plasma plume ablated from the graphite target in the deposition of Example 1 was investigated with a well-known Time-Of-Flight method, for example described in publication D. Yarmolich et. al, Plasma Sources Sci. Technol. 17 (2008) 035002. In particular, the ion current of the plasma plume was measured with a biased Faraday Cup at distances 30-50 cm from the ablation point on the target. The results are shown in FIG. 2.

The delay of an ion current peak increase with distance was transformed to the linear velocity. The lines in FIG. 2 show the delay of the Faraday Cup ($I_{FC}$) depending on distance. The velocity of the plasma front was found to be of $4 \cdot 5 \cdot 10^6$ cm/s and the carbon ion maximum flux propagated with velocity of $2 \cdot 10^6$ cm/s.

The carbon ion flux (number of ions arriving to the substrate per unit of surface area per unit of time) can be estimated by integrating the Faraday Cup current over unit of time that provides the total charge of arrived ions and dividing it by the ion charge ($1.6 \cdot 10^{-19}$ C) and the area of the Faraday Cup current collector.

Figure 3:
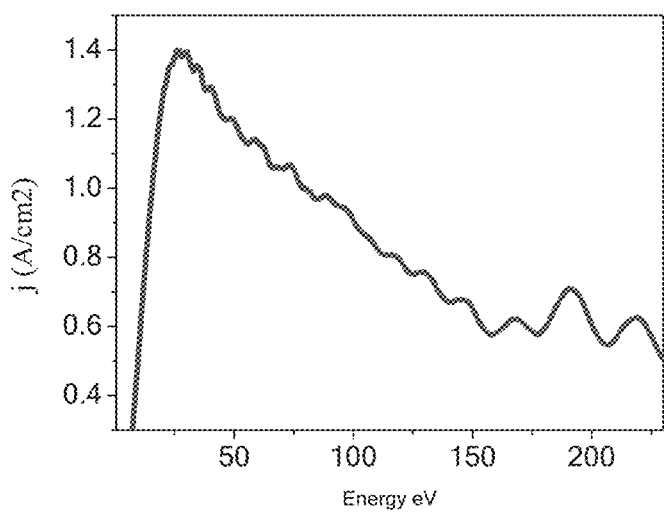
FIG. 3 is a graph showing a non-normalised energy distribution of the carbon ions generated in the VCD process of Example 1.

With reference to FIG. 3, the velocity of the carbon ions can be transformed to a non-normalized Energy Distribution. Most of the ions have an energy in the range of from 10 eV to 150 eV, and significant amount of the ions have energy above 100 eV. There is some amount of the ions that have energies above 150 eV. However, Faraday Cup measurements of the ions having an energy above 150 eV are not precise enough to quantify amounts accurately, due to the high secondary electron and ion emission.

Example 3—Deposition of Further Carbon Materials

Further depositions of carbon material were performed using VCD, generally as described hereinabove, in accordance with the parameters set out in Table 1:

TABLE 1

| Example | Substrate | Film Thickness | Pulse Energy (J) |
|---|---|---|---|
| 1 | Aluminium | 100 nm | 4.5 |
| 2 | Aluminium | 60 nm | 4.5 |
| 3 | Aluminium | 40 nm | 4.0 |
| 4 | Aluminium | 0.8 μm | 4.0 |
| 5 | Aluminium | ca. 1 μm | 4.0 |
| 6 | Aluminium | ca. 1.3 μm | 4.5 |
| 7 | Aluminium | ca. 5 μm | 4.0 |
| C7 | Free-standing | ca. 10 μm | 4.5 |
| C21 | Aluminium | ca. 1 μm | 4.5 |
| C22 | Aluminium | ca. 4 μm | 4.5 |
| C23 | Aluminium | ca. 10 μm | 4.5 |
| C51 | Copper | ca. 5 μm. | 4.5 |

Example 4—Characterisation EDX

Figure 4:
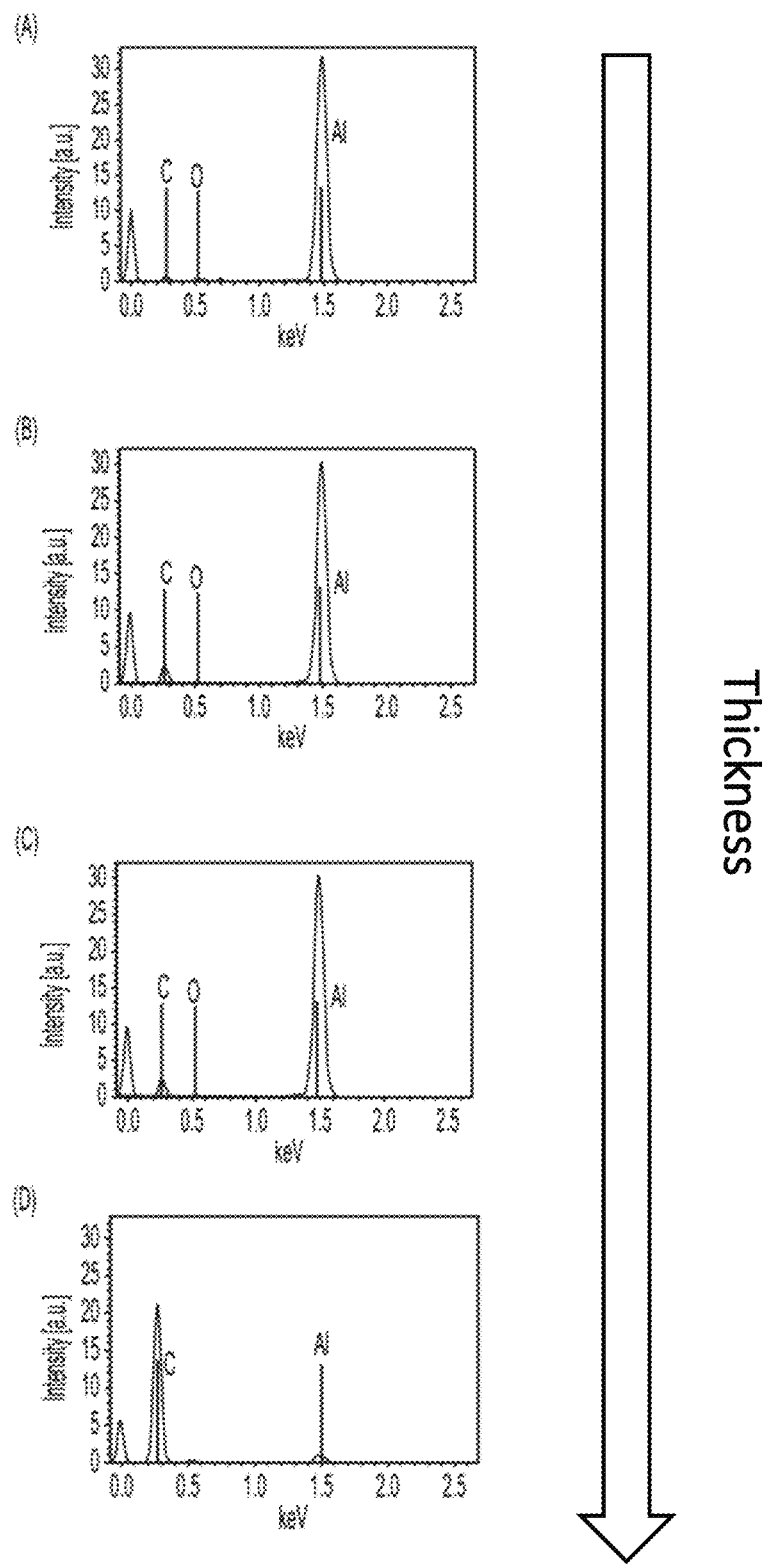
FIG. 4 is a series of graphs showing energy-dispersive X-ray spectroscopy (EDX) results for selected samples from Example 3. (A): Sample 3; (B): Sample 4; (C): Sample 5; (D): Sample 7.

FIG. 4 shows energy-dispersive X-ray spectroscopy (EDX) results for samples 3, 4, 5 and 7 from Example 3. EDX analysis of the carbon material in each sample revealed the presence of three elements only: carbon (film); aluminium (substrate); and oxygen (oxide layer formed on the aluminium substrate). The signal strength of the oxygen and aluminium decreased with increasing thickness, confirming that the films are pure carbon. The aluminium peaks almost disappear in the EDX spectrum for sample 7, which has the thickest layer of carbon material.

Example 5—SEM Images

FIG. 5 shows scanning electron microscope (SEM) images of a cross-section of sample C7. FIG. 5a shows two clearly distinguishable zones, which correspond to different growing modes of the film during VCD deposition. The upper surface and its adjacent zone is dense and representing the initial stage of the film growth. The second one starting at ~1 μm thickness from the upper surface is largely granular. SEM analysis shows the complex hierarchical morphology of the carbon material which consists of grains with sizes 10-100 nm (FIG. 5c), 100-1000 nm (FIG. 5b) and above 1 micron (FIG. 5a). Grains with the size 100-1000 nm have a characteristic repeatable shape (see FIG. 5b-c). One can also estimate the pore size between the grains that is 20-100 nm from FIG. 5c, 100-1000 nm from FIG. 5b and above 1 micron (FIG. 5a).

Example 6—FIB-SEM Image

Figure 6:
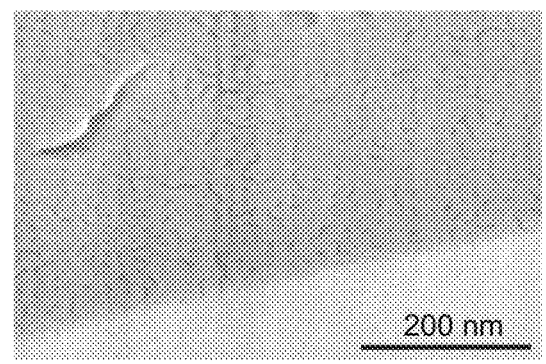
FIG. 6 is high resolution Focused ion beam (FIB) SEM image of sample C51 of Example 3.

In order to check the porosity below 20 nm a (Focused ion beam) FIB SEM was employed. FIG. 6 shows a FIB SEM image of sample C51 containing the pores in the range 1-20 nm.

Example 7—XPS and sp2/sp3 Hybridization Ratio

Figure 7:
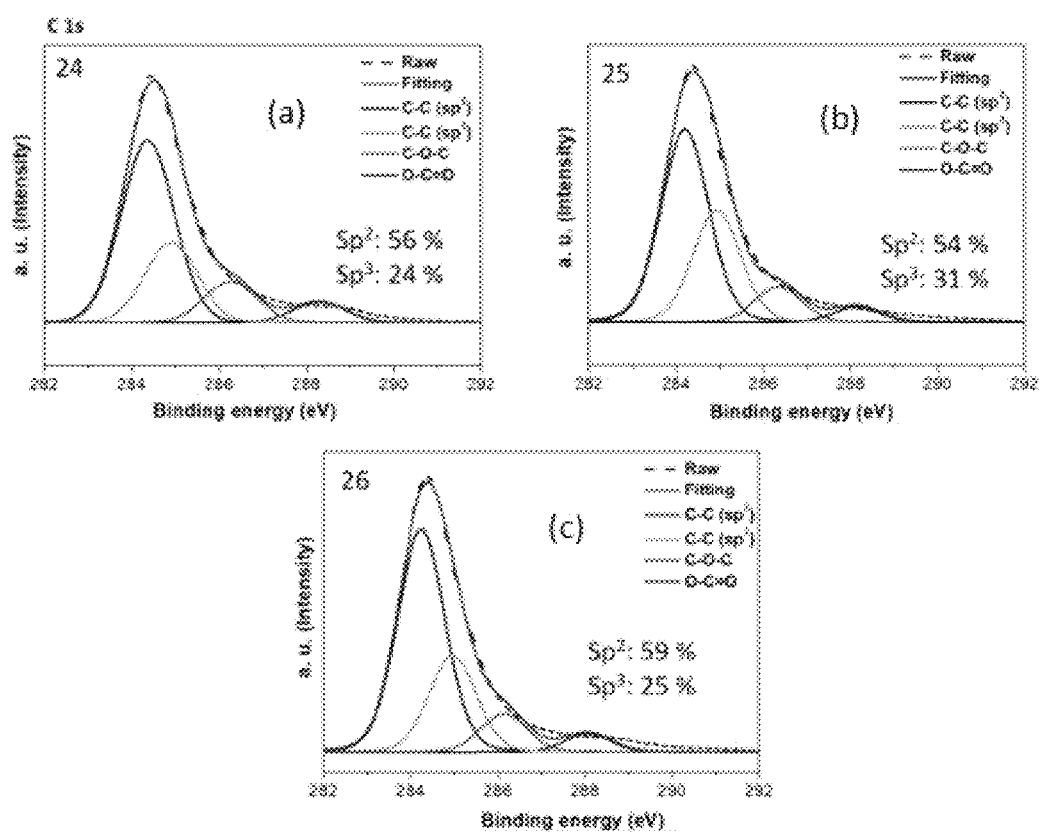
FIGS. 7(a)-(c) are XPS spectra of the carbon material samples I-K, respectively, of Example 13.

FIGS. 7a to 7c show XPS spectra of Examples I to K from Table 4, respectively. A near ambient pressure (NAP) X-ray photoemission spectroscopy (XPS) system (Thermo Scientific™ ESCALAB™ 250Xi) was used for elemental and carbon bonding analysis. The system provides the following complementary capabilities:

X-ray photoemission spectroscopy (XPS) for chemical analysis of surfaces under inert/UHV conditions (sensitivity to the chemical structure near the outmost of the surface (0.5-8 nm));

Depth profiling x-ray photoemission spectroscopy (DPXPS) which combines a sequence of argon ion gun etch cycles (The sputter rate estimate: $Ta_2O_5$=0.1 nm/sec) with XPS analysis XPS analysis of the free-standing carbon material films shows a rather unusual ratio between $sp^2$ and spa hybridized bonds.

The significant amount of $sp^2$ bonds are in line with the TEM, Raman and XRD results suggesting the existence of ordered strands of 2D sheets of carbon.

Example 8—TEM Images of Carbon Material on a Copper Grid

Figure 8:
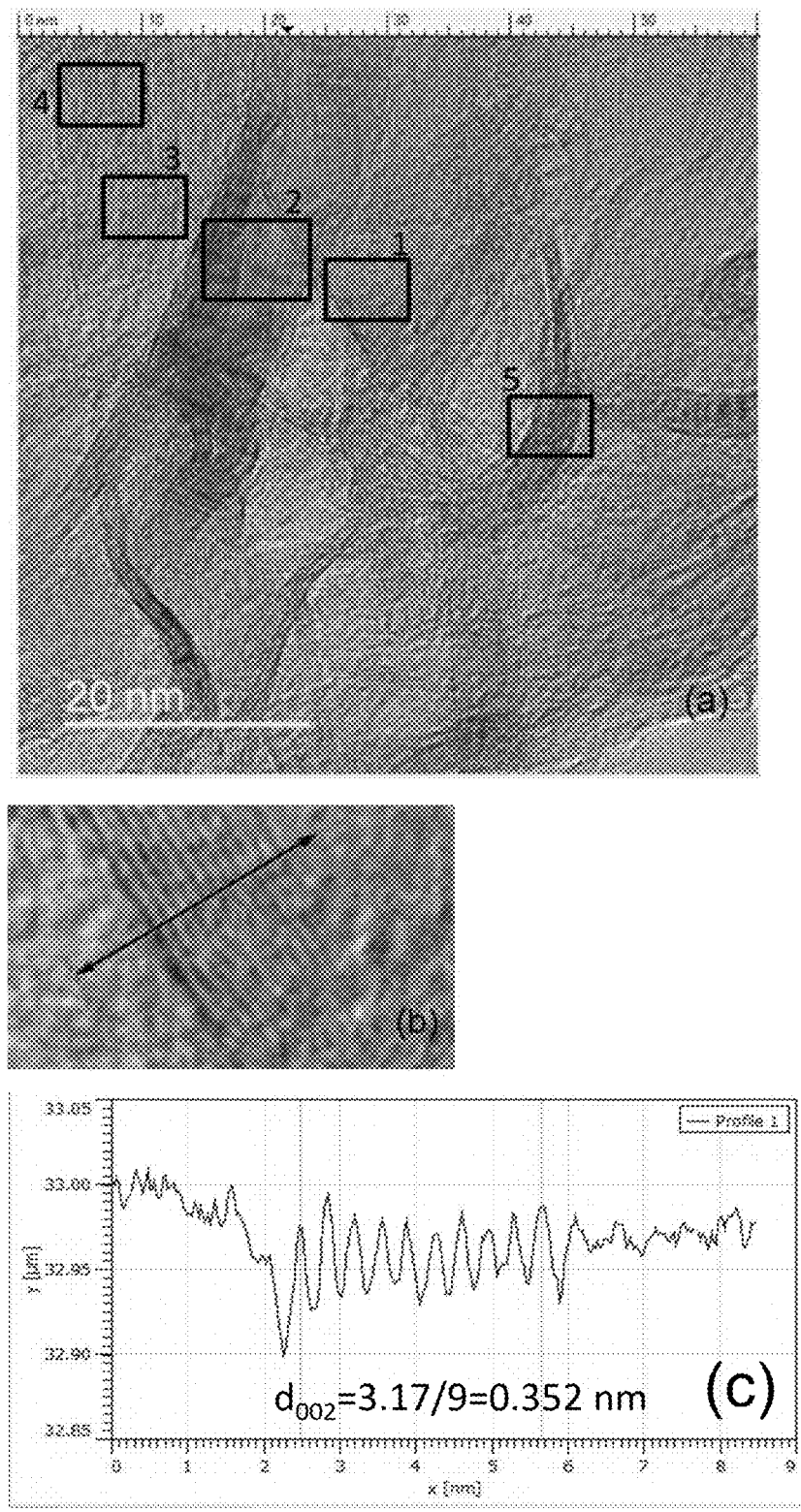
FIG. 8(a) is a transmission electron microscope (TEM) image of the carbon material sample of Example 8.
FIG. 8(b) is an enlarged image of zone 1 of FIG. 8(a)
FIG. 8(c) is a graph showing the pixel intensity along the arrow in FIG. 8(b)

FIG. 8a shows transmission electron microscope (TEM) images of the carbon material deposited on a copper grid, in accordance with the general method outlined above.

STEM studies have been performed in a state-of-the-art analytical instrument (FEI Tecnai Osiris) designed for easy TEM imaging and fast chemical mapping in scanning transmission electron microscope (STEM) configuration using energy dispersive X-ray and electron energy loss spectroscopies (EDX and EELS) with primary beam energy of 200 keV. TEM imaging is accommodated with a Gatan UltraScan1000XP (2048 by 2048 pixel) camera with high-speed upgrade. Four STEM detectors (HAADF, DF4, DF2 and BF) allow angular integration over a wide range of collection angles and are compatible with the EEL spectrometer. EDX detectors are FEIs Super-X system employing 4 Bruker silicon drift detectors (SDD) for high collection efficiency (>0.9 sr solid angle) and high count rates (>250 kcps). EELS is performed using Gatan's Enfinium ER 977 spectrometer with electrostatic shuttering and fast Voltage Scan Module for Dual EELS (sequential low-loss and high-loss spectrum acquisition) and Range EELS.

The TEM images show that there are a few nanocrystals with a size of about 10 nm embedded in the amorphous carbon. The nanocrystals shown in FIG. 8a appear to represent parallel sheets of graphene or Net W or another 2D carbon allotrope packed at the structure with the $d_{002}$ spacing larger than that of graphite (0.335 nm). Five different zones of FIG. 8a designated by rectangles were analysed on the nanocrystals $d_{002}$ spacing.

FIG. 8b shows zone 1 of FIG. 8a. There are clear black and white strips representing nine 2D carbon layers. The pixels intensity along the arrow shown in FIG. 8b are shown in FIG. 8c. Averaging the distance between the peaks in FIG. 8c provides the $d_{002}$ spacing for the nanocrystal in the zone 1 as 0.352 nm. The $d_{002}$ spacings obtained in the same way of five zones selected in FIG. 8a are shown in Table 2.

TABLE 2

| Interlayer distance | nm |
|---|---|
| $d_1$ | 0.352 |
| $d_2$ | 0.348 |
| $d_3$ | 0.353 |
| $d_4$ | 0.358 |
| $d_5$ | 0.366 |
| average | 0.355 |

Example 9—Raman Spectra

In order to further confirm the structure, the carbon material film was investigated using Raman spectroscopy.

For Raman measurements a Renishaw Ramascope-1000 was used, with a 30 mW 514.5 nm Ar excitation laser operated with the holographic Notch-filter with cut-off at ~150 cm$^{-1}$. The data collection was calibrated against a silicon standard. The instrument offers spectral resolution of 0.1 cm$^{-1}$ and spatial resolution of 1 µm. Variable laser power levels (1-100%) were used at an integration time of 10 s. Spectra were normally collected at 5 different randomly selected point of the sample surfaces in the range of 100-3200 cm$^{-1}$ Raman shift. The spectra background was subtracted with the Bio-Rad KnowItAll software and the peaks were de-convoluted using Origin software.

Figure 9:
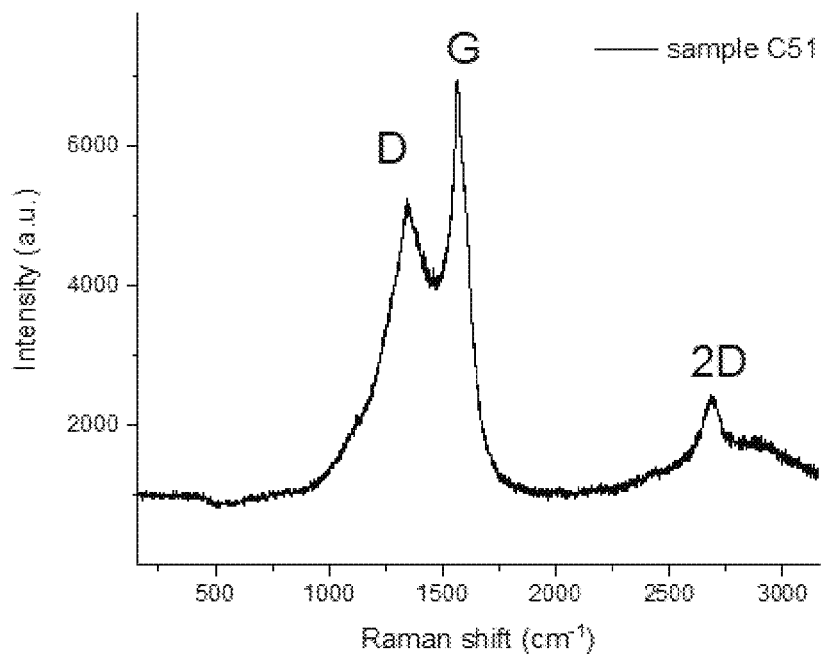
FIG. 9 is a Raman spectrum of carbon material sample C51 of Example 3.

All samples showed the typical structure of disordered nanostructured carbon. An exemplar Raman spectra with G band at around 1340 cm$^{-1}$, D band at around 1600 cm$^{-1}$ and 2D band at around 2680 cm$^{-1}$ of sample C51 can be found in FIG. 9. The ratio and shape of the bands depend on the VCD parameters as well as thickness of the film. The intermixed graphitic content with sp$^2$ (graphitic) and sp$^3$ (diamond) carbon bonds was further confirmed by deconvolution of the first order Raman spectra.

Example 10—XRD and Allotropic Structure

Figure 10:
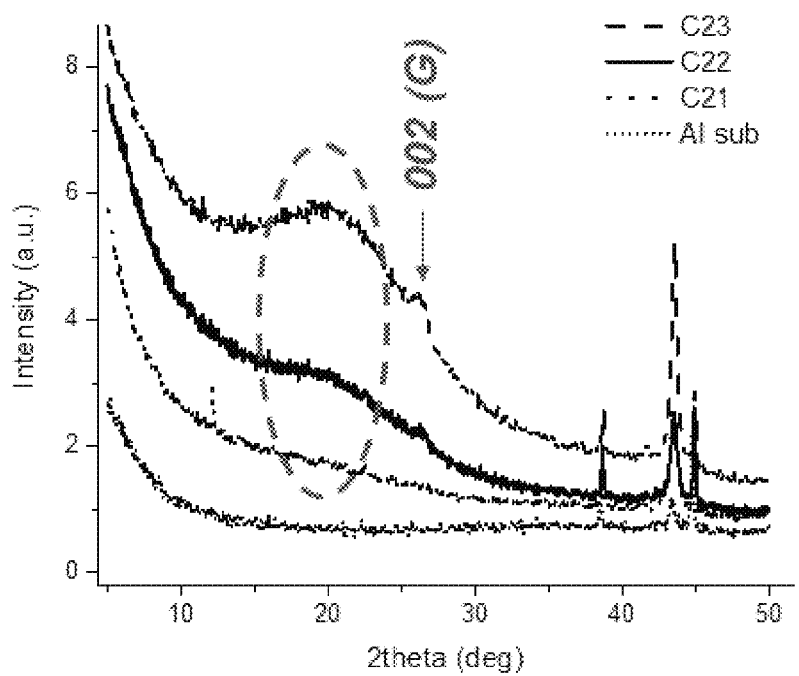
FIG. 10 is a graph showing the X-ray diffraction spectroscopy (XRD) spectra of the carbon material samples C21, C22 and C23 of Example 3, along with that of an aluminium substrate.

FIG. 10 shows the XRD spectra in Bragg-Brentano geometry for samples C21, C22 and C23 and Al substrate.

X-ray diffraction (XRD) was performed with a D8 Advance Bruker diffractometer (position sensitive detector (LynxEye EX)~6.5% energy resolution, moving slit to reduce background scattering at low angles, best instrumental resolution~0.06° in 2theta & ~0.03° in omega) equipped with Cu K α. The 2θ angle was varied with a step size of 0.02-0.04°. In order to achieve reasonable intensity, long counting times (up to 14 s/step) were utilized. With the same intention, the use of Ni-filters was avoided.

For all samples a broad peak around 20 deg is observed that most probably corresponds to agglomerates of 2D carbon monolayers. The peak was found to be shifted towards smaller angles than reported in the literature for hard carbon ('Mechanism of lithium insertion in hard carbons prepared by pyrolysis of epoxy resins', doi: 10.1016/0008-6223(96)00177-7). The peak at around 26.5 deg indexed as 002 of graphite-like unit cell and indicates the presence of the nanocrystals. This observation is in agreement with the TEM data.

The presence of these two characteristic peaks on the same XRD pattern has never been reported in the literature.

Example 11—XPS Spectra

Figure 11:
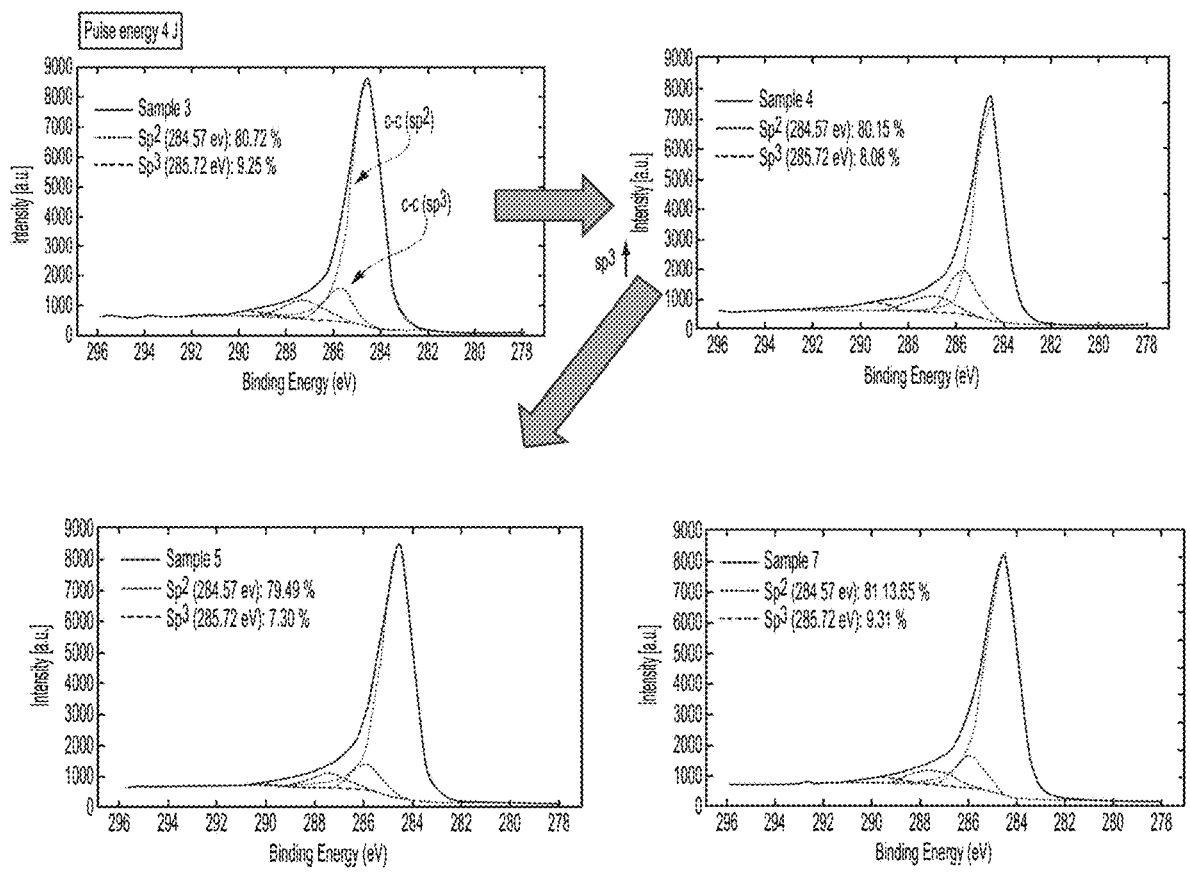
FIG. 11 is a series of X-ray photoelectron spectroscopy (XPS) spectra of the carbon material samples 3, 4, 5 and 7 of Example 3.

The X-ray photoelectron spectroscopy (XPS) spectra for samples 3, 4, 5 and 7 of Example 3 are shown in FIG. 11. A near ambient pressure (NAP) X-ray photoemission spectroscopy (XPS) system (Thermo Scientific™ ESCALAB™ 250Xi) was used.

The XPS results are in good agreement with both XRD and Raman. The film is pure carbon, with a mixture of sp$^2$ and sp$^3$ bonds and some carbon-oxygen bonds were observed, however the amount of oxygen is lower comparing to the free-standing films of example 7. The oxygen was absorbed after the samples were extracted from the vacuum chamber and the free standing carbon nanomaterial absorbs more than deposited on the Al substrate.

Discussion of Examples 1 to 11

Without wishing to be bound by theory, it appears that the structural features of the carbon materials were formed due to the high kinetic energy and flux of the carbon ions during the deposition. It is posited that the processes during the deposition may be understood as follows:

1. The pure carbon ions in significant amount (>10$^{12}$ ions per cm$^2$ of the substrate) arrive to the substrate during short time<50 us (see FIG. 2) with high kinetic energies (see FIG. 3)
2. The incoming ions collide with the previously deposited film or substrate losing their energy (usually <10 eV per collision) so a few collisions are required before the incoming ion will stop somewhere under the surface.
3. Those high-energy ions (>20 eV) are sub-planted into the substrate or previously deposited film on a depth of few atomic layers (see Y. Lifshitz et. al, Diamond and Related Materials 4 (1995) 318, and references within it). Lifshitz did not obtain the same structure of materials probably because of low flux of the carbon ions (100 times lower than in various embodiments of the invention) and his process was not pulsed.
4. Then there is a relaxation time (between pulses) when the internal stress generated within the film due to the sub-plantation is relaxed. This is a temperature-dependent process and in our case the temperature is <60 degrees C.
5. Next pulse comes in at least 100 us after all the processes in the film are finished The overall process can be imagined as implanting carbon ions with high energy inside the film, the film thus growing from inside. This process of the material formation can be considered as the formation of carbon material with exceeding energy brought with the carbon ions. The energy of the ions goes into the formation of a crystal stricture which preferably should have as much internal energy as possible. Structures with high surface area usually have more internal energy, hence the favourable structure obtained with the high-energy and high-intensity ion beam should have a morphology with a high surface area. The presence of spa bonds suggests additional way to accommodate the high internal energies per carbon atom.

Example 12—Conductivity of Carbon Material Deposited on Glass

The conductivity of carbon material films deposited over glass at various thicknesses was investigated. Samples A to H were prepared according to the general method outlined above by depositing carbon onto a glass substrate according to the general method of Example 1 with a pulse energy of 4.5 J. The carbon layer thickness and the deposition process parameters were varied between the samples.

Resistance and resistivity were determined with a 2-point probe method using a Keithley 2002 multimeter.

The properties of samples A to H are shown in Table 3 below.

The conductivity and resistivity of the carbon material films was found to be dependent upon the thickness that corresponds to the number of VDC pulses applied to form the film.

TABLE 3

| Example | Number of pulses (×1000) | Resistance (MΩ) | Resistivity (Ω · m) | Conductivity (S/m) |
|---|---|---|---|---|
| A | 25 | 25.94 | 0.99769 | 1.00231303 |
| B | 50 | 7.320 | 0.56308 | 1.775956284 |
| C | 100 | 1.800 | 0.27692 | 3.611111111 |
| D | 150 | 0.828 | 0.19108 | 5.233494364 |
| E | 10 | 29.72 | 0.57154 | 1.749663526 |
| F | 30 | 3.810 | 0.21981 | 4.549431321 |
| G | 70 | 0.656 | 0.08831 | 11.32404181 |
| H | 260 | 0.269 | 0.12415 | 8.054522924 |

The conductivity of the carbon material film is due to the $sp^2$ bonds which can be metallic type for net W carbon allotrope, semi-metallic type for graphene or graphite, while the diamond bonds sp3 favour a non-conductive material behaviour. The conductivity can be improved with use of metal doping.

Example 13—Free Standing Carbon Materials

In samples I to K relatively thick (>200 nm) carbon material films were separated from their substrates to provide a free-standing carbon material film. In each case, deposition of the carbon material film was carried out according to the general method outlined above, and then the film was mechanically separated from the substrate. Example J was carried out with a polyethylene terephthalate (PET) substrate onto which a thin film of stainless steel was deposited prior to the deposition of carbon. The deposition process parameters and substrates used in each sample are shown in Table 3 below.

TABLE 4

| Example | Number of pulses (×1000) | Approx. thickness (nm) | Substrate |
|---|---|---|---|
| I | 50 | 800 | Stainless steel |
| J | 30 | 500 | Stainless steel on PET |
| K | 50 | 800 | Stainless steel |

Figure 12:
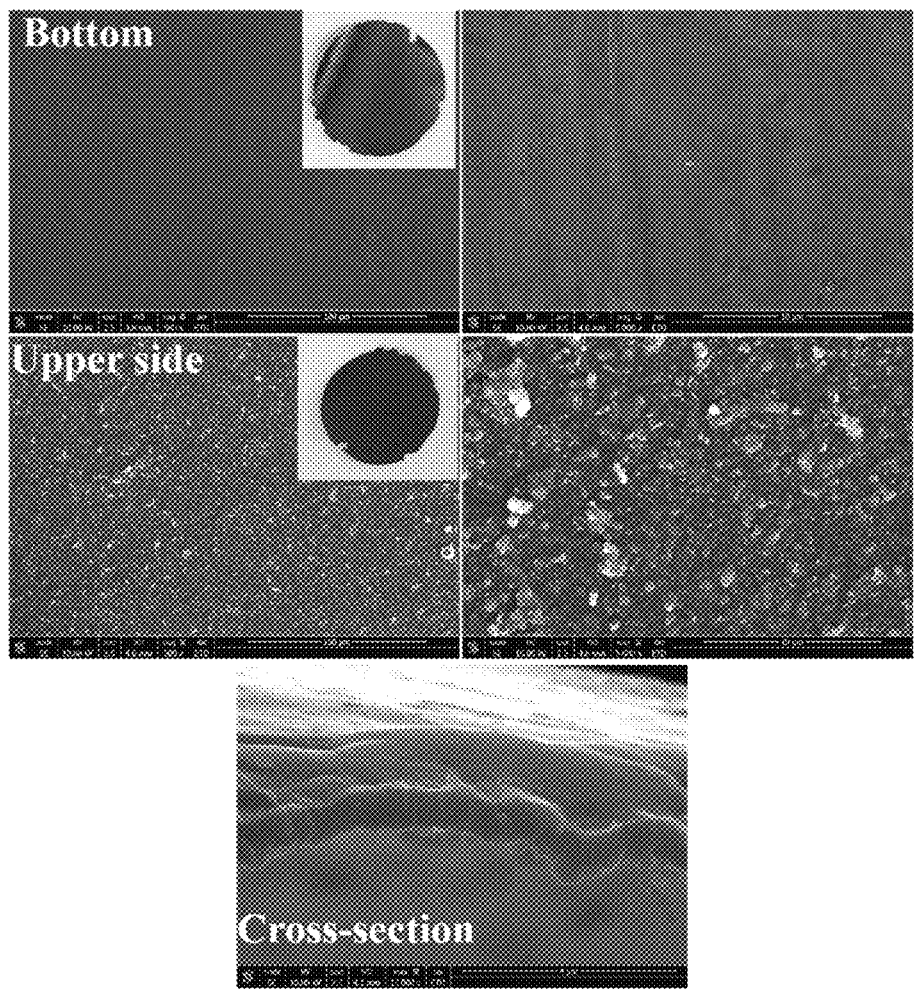
FIG. 12 is a series of SEM images of free-standing films of a carbon material sample of Example 13.

SEM images showed the bottom side of the free-standing films to be smooth; similar to the smoothness of the stainless steel foil substrate to which is was previously attached. FIG. 12 shows the top side of the free-standing film was rough, similar to the roughness observed in the SEM images of the film adhered to an aluminium substrate.

Figure 13:
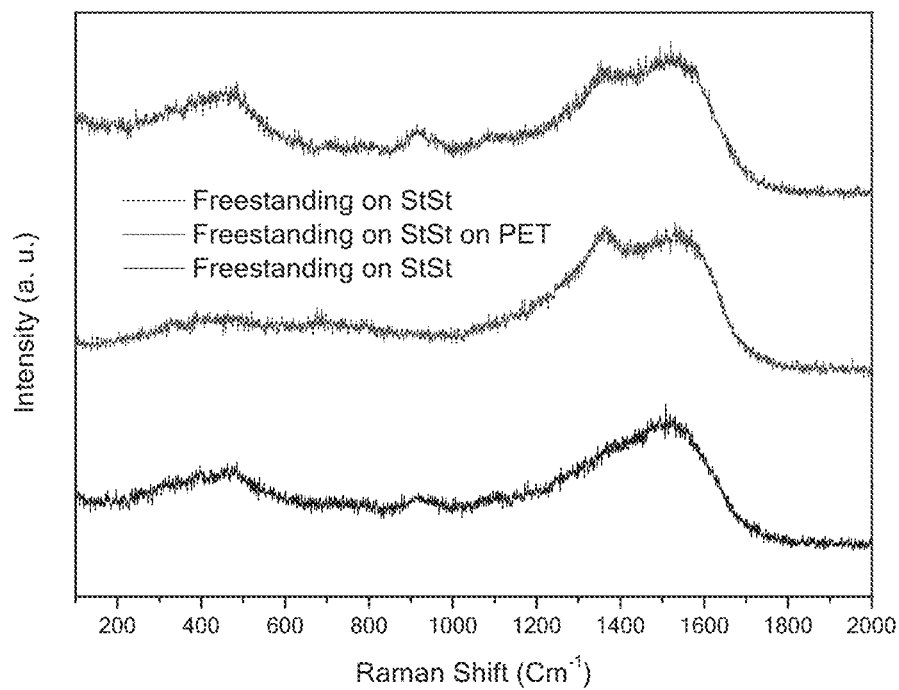
FIG. 13 is the Raman spectra of free-standing films of the carbon material samples of Example 13.

FIG. 13 shows a comparison of the Raman spectra of Examples I to K (top line: example I; middle line: example J; bottom line: example K) taken from the upper side. The Raman spectra of the upper side of all three spectra has a signal at D: 1350 $cm^{-1}$ and G: 1580 $cm^{-1}$ of the carbon. Also there are peaks in the area between 200-1100 $cm^{-1}$ that that suggests the presence of some of the removed substrate material integrated into the carbon film. This confirms the formation of strong bonds between the film and the substrate.

Example 14: Doping/Mixing with Iron

Figure 14:
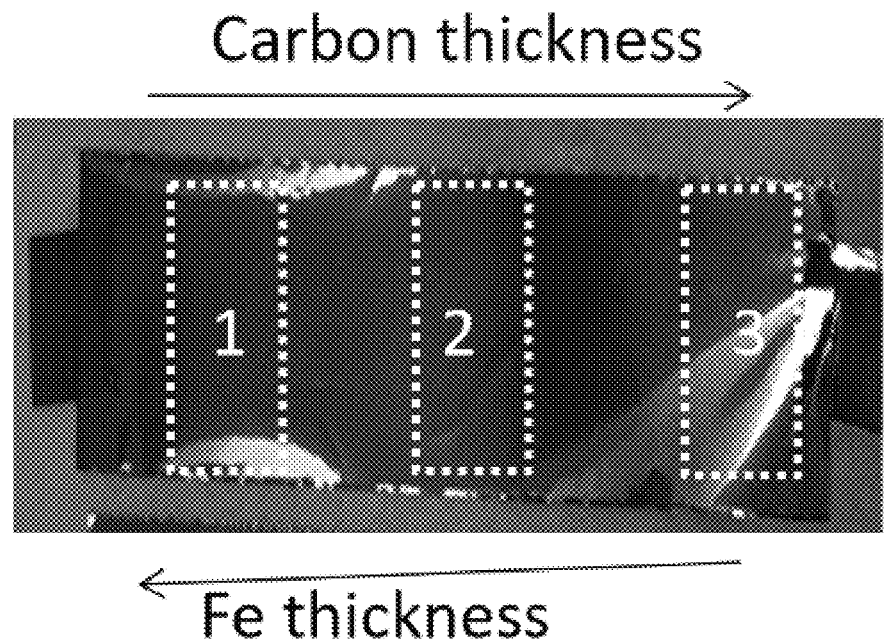
FIG. 14 is a photograph of a strip of iron-doped carbon-containing material with a gradually increasing of iron content along the length of the strip.

A strip of iron-doped carbon-containing material was prepared with a gradually increasing gradient of iron content along the length of the strip, as shown in FIG. 14.

In order to prepare the strip of carbon material doped/mixed with iron, a vacuum chamber was set up having a first VCD source with a graphite target (deposition process was the same as the sample I of example 11) and a second VCD source with an iron target. The iron target was ablated in such a way that the ablated iron material arrived at the same aluminium substrate as the ablated carbon.

The experiment was initially performed with independent control of the second VCD source so that the parameters of the ablated iron plasma could be adjusted to provide the required different energies, timing of pulses, densities etc of the iron ions arriving at the substrate. This allowed the structure and abundance of dopant material to be precisely controlled. The pulses of carbon and other material plasmas can be arranged to arrive at the substrate simultaneously, alternating pulse by pulse, or alternating a number of pulses of the first material and then a number of pulses of the second material.

The iron-doped carbon material was prepared such that the centre of deposition of carbon was towards the left side of the as strip, whilst the centre of deposition of iron was on the right of the strip. Hence, the iron-doped material was prepared in such a way that there was a gradual increase in carbon content and a gradual decrease in iron content from left to right across the strip.

Figures 15A, 15B:
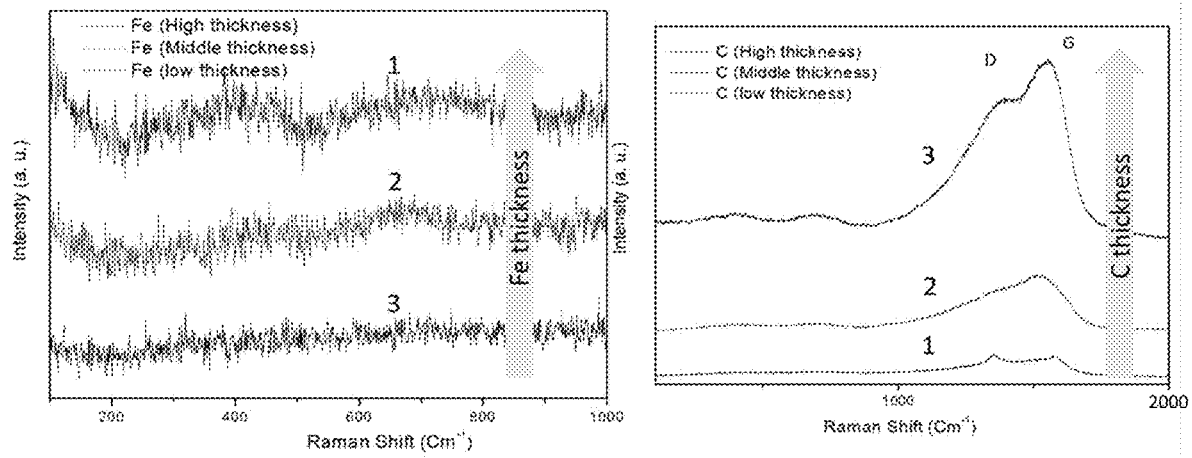
FIGS. 15(a) and (b) are Raman spectra of three different areas of the strip of iron-doped carbon-containing material of FIG. 14.

Raman analysis was performed on three different areas of the strip of iron-doped film prepared above, as shown in FIG. 15a and FIG. 15b. Area 1 of the strip (on the far left of the strip) corresponds to approximately 90% iron and 10% carbon film. Area 2 of the strip (in the centre of the strip) corresponds to approximately 50% iron and 50% carbon film. Area 3 of the strip (on the far right of the strip) corresponds to approximately 10% iron and 90% carbon film. The Raman spectra confirmed the abundance of material in each area of the strip.

For Fe samples, Fe peak intensity increased as the thickness increased. For C samples, all samples showed a crystalline and amorphous mixed structure.

Figures 16A, 16B:
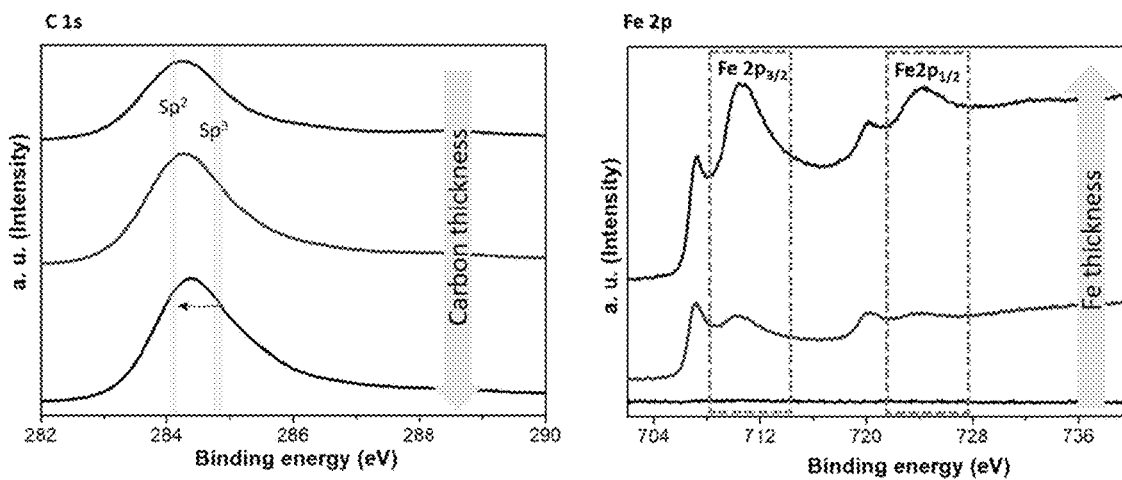
FIGS. 16(a) and (b) are graphs showing XPS analysis of the carbon (FIG. 16(a)) and Fe content (FIG. 16(b)) in areas 1, 2, and 3 of the iron-doped film strip of FIG. 14.

FIG. 16a shows XPS analysis of the carbon content in areas 1, 2, and 3 of the strip. There is a noticeable shift in the character of the carbon bonds from sp3 to $sp^2$ as the carbon content of the strip increases. FIG. 16b shows XPS analysis of the iron content in areas 1, 2, and 3 of the strip.

In conclusion, this study demonstrates the possibility of doping carbon-containing films with iron. This technology can be used to dope carbon-containing materials with any other material.

Example 15: Battery Test

Electrodes were formed by depositing carbon material (0.1 mg) on standard copper over an area of about 1.13 $cm^2$ without any additional material interlayers, i.e. the carbon material was deposited directly onto the copper foil.

The deposition conditions for the carbon material were the same as sample 6 of Example 3.

The electrochemical properties of the electrodes as anodes in lithium ion cells were investigated using 2032-type coin cells with a lithium foil counter electrode and 1M $LiPF_6$ in ethylene carbonate/dimethyl carbonate (EC/DMC) (1:1 v/v) as the electrolyte, and separator [Celgard 25 μm Trilayer polypropylene-polyethylene-polypropylene membrane].

The specific capacities of the electrodes were calculated from the total masses of active materials, and their electrochemical characteristics were examined by charge-discharge curves using a galvanostat (CT2001A, LAND) within a 0.01-3 V range.

Figure 17A:
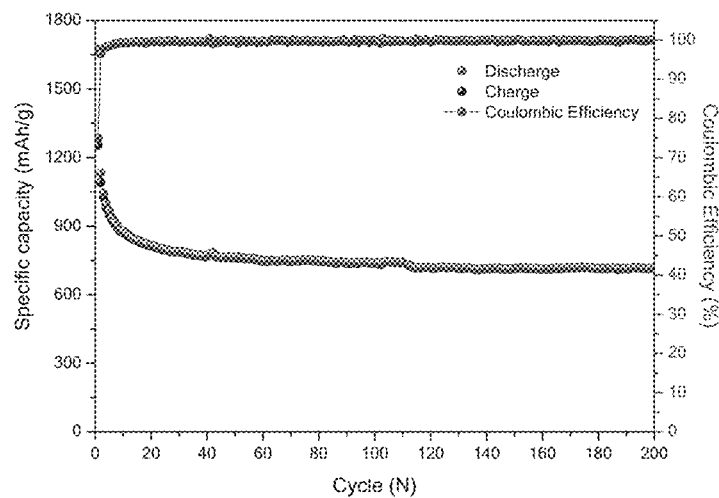
FIG. 17(a) is a graph showing the cyclability of the coin cell test battery with the carbon material on copper electrode.

An electrochemical test of the coin cell test battery with the carbon material on copper electrode was performed over 200 cycles. FIG. 17a show the cycleability (~200 cycles) of the carbon material on copper electrode. The specific capacity of the 200th cycle was observed to be 716 mAh/g at a current of 0.5 A/g. This shows that carbon material has a higher specific capacity than graphite (theoretical specific capacity of 372 mAh/g) at relatively high current density and that this capacity is stably retained over 200 cycles with insignificant losses. The first cycle capacity of 1700 mAh/g was found to become irreversible and it is thought that this is related to the formation of Solid-Electrolyte Interface (SEI) during first 20 cycles. The SEI formation requires further investigation.

Figure 17B:
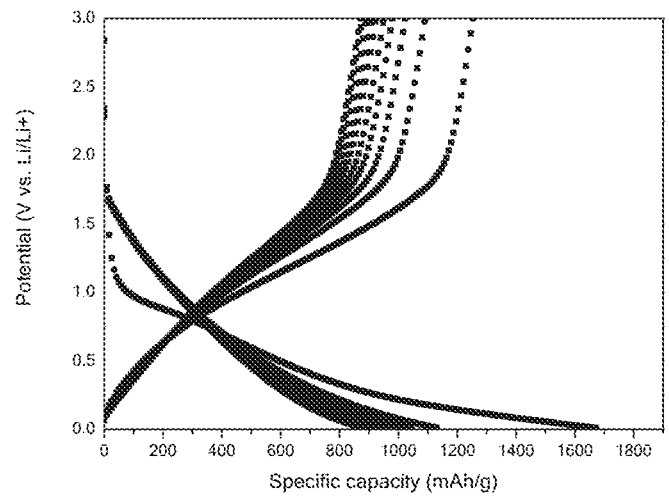
FIG. 17(b) is a graph showing potential versus specific capacity of the cell.
Figure 18A:
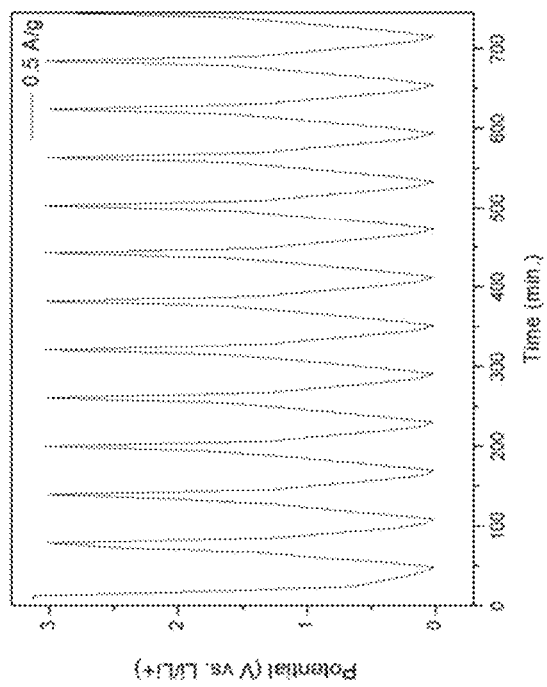
FIGS. 18(a) and (b) are graphs showing the results of tests on the cycle life of the carbon material on copper electrode as anode in a lithium ion half-cell setup.
Figure 18B:
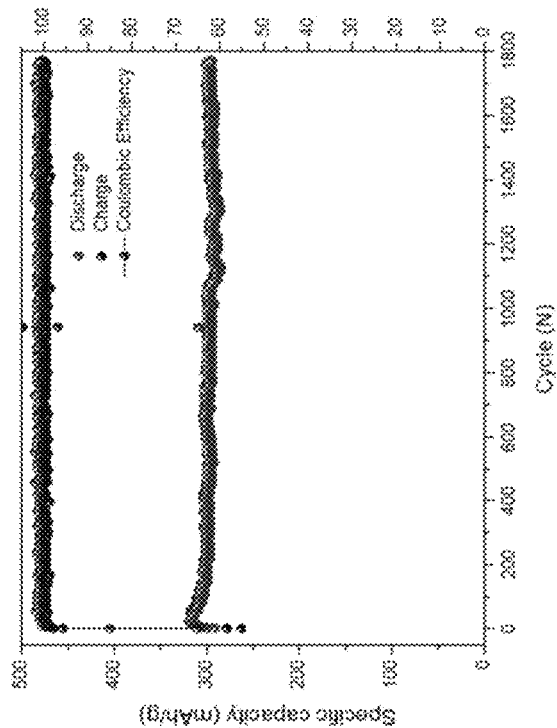

With reference to FIG. 17b, since at full capacity the potential against lithium is zero volts, all available lithium sites appear to be utilised during discharge, which is reproducible even after 200 cycles.

Discussion of Examples 13 to 15

The battery performance of the examined embodiments of carbon material is postulated to originate from their structure, which defines metal or semi-metal conductivity, and a Li ion intercalation mechanism between the 2D layers of carbon. It is thought the 2D layers consist of the net W carbon allotrope or other similar to graphene 2D structure which provides both the electronic conductivity and an intercalation mechanism. The distance between the 2D layers are slightly larger than in graphite, providing the space for the Li ion intercalation. The hierarchical porosity of the carbon materials is also beneficial for the battery performance.

In summary, the examined carbon materials' benefits for batteries can be summarised as follows:
1. Crystalline areas with 2D structures which provides metallic electrical conductivity.
2. Larger-than-graphite distance between 2D layer enables higher capacity of Li ions intercalated into the carbon material.
3. Hierarchical porosity of carbon material enhances electrolyte penetration and increases specific capacity.
4. Presence of spa bonds improves mechanical hardness of the carbon material, which enhances cyclability.
5. Formation of chemical bonds with the substrate/current collector improves contact/battery impedance.
6. Possibility to dope the carbon materials with materials (Si, for example which have high specific capacity) which can improve further the battery performance.
7. Possibility to deposit carbon material on the battery components without use of binder improves further the battery weight hence improving energy density of the cell.
8. Combination of the material conductivity with good contact/adhesion to the substrate and with the good penetration of electrolyte into the carbon material through the hierarchically arranged pores provides a high rate of charging/discharging currents (up to 10 C) of the battery cell.

In conclusion it was found that the carbon material can be used as an electrode material in batteries or supercapacitors. The application for energy storage can be achieved with different setups, using different electrolytes and/or second electrode materials.

The invention claimed is:

1. An electrode for an electrochemical cell, the electrode comprising a carbon material formed by exposing a substrate to a flux of at least $10^{11}$ carbon ions per $cm^2$ of substrate per 1 ms while the substrate is at a temperature of less than 60° C., a majority of the carbon ions having a kinetic energy of at least 10 eV to provide a carbon material comprising $sp^2$ and spa hybridized carbon having a hierarchical porosity to provide a specific lithium storage capacity of at least 400 mAh/g, the percentage of $sp^2$ type carbon being at least 25 w % based on the total weight of the material, the percentage of $sp^3$ type carbon being at least 20 w % based on the total weight of the carbon material, the carbon material comprising at least one area with a plurality of regularly arranged, graphene-like layers of carbon and the at least one area is embedded in amorphous carbon.

2. The electrode of claim 1, wherein the carbon material is deposited on the substrate without any binders to adhere the carbon to the substrate.

3. The electrode of claim 1, wherein an inter-layer spacing between individual layers in the plurality of layers is greater than 0.335 nm.

4. The electrode of claim 1, wherein the carbon material has an electrical conductivity of at least 1 S/m.

5. The electrode of claim 1, wherein the carbon material has an initial specific lithium storage capacity of at least 1000 mAh/g at a first charge cycle.

6. The electrode of claim 1, wherein the material has a surface area of at least 1000 $m^2$/g.

7. The electrode of claim 1, wherein the carbon material comprises from 0.1 w % to 30 w % of one or more additives or dopants, wherein the one or more additives or dopants comprise an element selected from the group consisting of Si, P, Fe, Cu, Li, Al, N, O, S, P, B, Ti, Co, Ni, Na, K, and combinations thereof, and wherein the one or more additives or dopants are either co-deposited with the carbon or incorporated into the carbon material as a plurality of particles or layers.

8. A method of making an electrode for an electrochemical cell, the method comprising: exposing a substrate to a flux of at least $10^{11}$ carbon ions per $cm^2$ of substrate per 1 ms while the substrate is at a temperature of less than 60° C., a majority of the carbon ions having a kinetic energy of at least 10 eV to provide a carbon material comprising $sp^2$ and $sp^3$ hybridized carbon having a hierarchical porosity to provide a specific lithium storage capacity of at least 400 mAh/g, the percentage of $sp^2$ type carbon being at least 25 w % based on the total weight of the material, the percentage of $sp^3$ type carbon being at least 20 w % based on the total weight of the carbon material, the carbon material comprising at least one area with a plurality of regularly arranged, graphene-like layers of carbon and the at least one area is embedded in amorphous carbon.

9. The method of claim 8, wherein the flux is provided by a virtual cathode deposition (VCD) process.

10. The method of claim 8, further comprising co-depositing one or more dopants or additives to form part of the carbon material or incorporating the dopant or additives into the carbon material as particles or layers.

11. The method of claim 8, further comprising separating the carbon material from the substrate to provide a free-standing carbon material film.

12. The electrode of claim 1, wherein the electrode substrate comprises a current collector, the current collector comprising a metal foil.

13. The electrode of claim 1, wherein the electrode substrate comprises a current collector, the electrode further comprising an interlayer between the current collector and the carbon material, the interlayer comprising an element selected from the group consisting of Si, P, Fe, Cu, Li, Al, S, P, B, Ti, Co, Ni, Na, K, and combinations thereof.

14. The electrode of claim 1, wherein the electrode substrate comprises a polymeric support to support the carbon material, and the carbon material further comprises a current collector layer.

15. The electrode of claim 1, wherein the electrode substrate further comprises a polymeric substrate which is non-current collecting to provide a battery separator.

16. An electrochemical cell comprising the electrode of claim 1.

17. The electrochemical cell of claim 16, being selected from the group consisting of a lithium ion cell, a lithium metal cell, a sodium ion cell, a sulphur cell, a fuel cell, and a supercapacitor.

18. The electrode of claim 1, wherein the specific lithium storage capacity after 200 charge/discharge cycles is at least 400 mAh/g.

19. The electrode of claim 1, wherein the carbon material is formed by physical vapor deposition (PVD).

20. The electrode of claim 1, wherein the flux is pulsed with a pulsing frequency of between 1 Hz and 20,000 Hz, a pulse duration of between 0.1 µs and 1000 µs, and a total energy per pulse of greater than 2.5 J.

21. The electrode of claim 1, wherein the hierarchical porosity comprises a first set of grains having a size of between 10 nm and 100 nm, a second set of grains having a size of between 100 nm and 1000 nm, and a third set of grains having a size of greater than 1 pm.

22. An electrode for an electrochemical cell formed by exposing a substrate to a flux of at least $10^{12}$ carbon ions per $cm^2$ of substrate per 1 ms, a majority of the carbon ions having a kinetic energy of at least 20 eV to provide a carbon material comprising $sp^2$ and $sp^3$ hybridized carbon having a plurality of differentially sized pores to provide a specific lithium storage capacity of at least 1700 mAh/g, the carbon material comprising at least one area with a plurality of regularly arranged, graphene-like layers of carbon, the at least one area being embedded in amorphous carbon, the percentage of $sp^2$ type carbon is at least 25 weight % based on the total weight of the carbon material, the percentage of $sp^3$ type carbon is at least 20 weight % based on the total weight of the carbon material, the flux being provided in a plurality of pulses such that the carbon ions contact the substrate in less than 50 µs, a relaxation time between each of the plurality of pulses being at least 100 µs, and the temperature of the substrate being less than 60° Celsius.

23. The electrode of claim 1, wherein the percentage of $sp^2$ type carbon is between 54 w % and 59 w %, and the percentage of spa type carbon is between 24 w % and 31 w %.

24. The electrode of claim 1, wherein the percentage of $sp^2$ type carbon is between 79 w % and 81 w %, and the percentage of spa type carbon is between 7 w % and 9 w %.

25. The electrode of claim 1, wherein the flux is provided in one single pulse.

* * * * *